United States Patent
Morisson et al.

[19]

[11] Patent Number: 6,081,214
[45] Date of Patent: Jun. 27, 2000

[54] A/D CONVERSION DEVICE PROVIDED WITH A CALIBRATION ARRANGEMENT

[75] Inventors: Richard Morisson, Caen; Philippe Gandy, Thaon; Frédéric Darthenay, St Aubin/Mer, all of France

[73] Assignee: U.S. Philips Corporation, New York, N.Y.

[21] Appl. No.: 09/039,760

[22] Filed: Mar. 16, 1998

[30] Foreign Application Priority Data

Mar. 18, 1997 [FR] France ................................ 97 03290

[51] Int. Cl.[7] .............................. H03M 1/10; H03M 1/06
[52] U.S. Cl. ........................................ 341/120; 341/118
[58] Field of Search .................................... 341/118, 120, 341/155, 156, 159, 158; 330/252, 254, 261

[56] References Cited

U.S. PATENT DOCUMENTS

| | | | |
|---|---|---|---|
| 4,354,177 | 10/1982 | Sloane | 341/120 |
| 4,364,027 | 12/1982 | Murooka | 341/120 |
| 5,027,116 | 6/1991 | Armstrong et al. | 341/120 |
| 5,121,119 | 6/1992 | Higuchi et al. | 341/120 |
| 5,313,207 | 5/1994 | Kouno et al. | 341/156 |
| 5,446,455 | 8/1995 | Brooks | 341/145 |
| 5,530,444 | 6/1996 | Tice et al. | 341/156 |
| 5,587,688 | 12/1996 | Mulbrook | 330/254 X |

*Primary Examiner*—Michael Tokar
*Assistant Examiner*—Patrick Wamsley
*Attorney, Agent, or Firm*—Steven R. Biren

[57] ABSTRACT

An A/D conversion device includes: an amplifier AMP provided with regulating means controlled by a control signal OC or GC for adjusting the value of its output voltage V2, and an A/D converter ADC2 intended to convert the output voltage V2 of the amplifier AMP into digital signals.

The device includes means S0 or MUX for setting the input of the amplifier AMP at a reference potential when a calibration signal CALOS or CALG is active, and at least a calibration arrangement DEC0 or DECM each having a module comparing the output of the second converter ADC2 with a predetermined binary word, a module supplying the control signal OC or GC whose value depends on the result of said comparison, and means for storing the control signal OC or GC when the corresponding calibration signal CALOS or CALG is inactive.

8 Claims, 3 Drawing Sheets

A/D CONVERSION DEVICE PROVIDED WITH A CALIBRATION ARRANGEMENT

BACKGROUND OF THE INVENTION

The invention relates to an A/D conversion device having an input intended to receive an analog input signal, and an output intended to supply a digital output signal, comprising:

an amplifier having an output and an input intended to receive the analog input signal of the device, provided with regulating means, controlled by a digital control signal, for adjusting the value of a voltage supplied by the output of the amplifier, an A/D converter having an analog input connected to the output of the amplifier and an output intended to supply the digital output signal of the device.

Such a device is described in U.S. Pat. No. 5,313,207. This device is used within an A/D conversion circuit having a two-step structure in which a primitive analog signal is converted into a digital signal by a first A/D converter which supplies, at the output, a digital signal referred to as most significant word which constitutes an approximation of the digital value of the analog input signal and thus forms the most significant part of the digital output signal of the conversion circuit. The most significant word weight is converted into an analog signal by a D/A converter which supplies, at the output, a signal referred to as converted signal which corresponds to the transposition to an analog value of the approximate digital value supplied by the first A/D converter. Here, this converted signal takes the form of a current which acts on a device as described in the opening paragraph, in which the amplifier receives the primitive analog signal at the input. In this device, the control signal is actually constituted by the most significant word, the operation consisting of adjusting the value of the output voltage of the amplifier via the regulating means incorporating the analog conversion of said word. The amplifier thus supplies, at the output, an analog signal referred to as residual signal which is representative of a quantization error due to the approximation effected by the first A/D converter, which residual signal is converted within the device by a second A/D converter into a digital signal referred to as least significant word which thus forms the least significant part of the digital output signal of the conversion circuit. The amplifier in the known A/D conversion device can introduce a DC component, referred to as offset voltage, in the output signal which it supplies. This has detrimental consequences for the precision of the A/D conversion performed by the second converter. Indeed, this offset voltage artificially modifies the value of the signal which occurs at the input of said converter and may thus cause discontinuities in the development of the value of the output signal of the device as a function of the development of the value of the primitive analog signal, which is not acceptable.

SUMMARY OF THE INVENTION

It is an object of the invention to remedy this drawback by providing an A/D conversion device in which the offset voltage introduced by the amplifier is compensated by means of a regulation loop.

To this end, an A/D conversion device according to the invention is characterized in that it has an input intended to receive a calibration signal, and in that it comprises means for setting the input of the amplifier at a predetermined reference potential when the calibration signal is active, and a calibration arrangement comprising:

a comparison module, activated when the calibration signal is active, comprising a comparator intended to supply, at an output, a signal which is representative of at least one comparison between the digital output signal and a predetermined binary word, a control module having an input connected to the output of the comparison module and being activated when the calibration signal is active, intended to supply the control signal, whose value depends on the value of a signal received at the input of the control module, and storage means in which the value of the control signal is stored when the calibration signal is inactive.

When such a device functions in the calibration mode, i.e. when the calibration signal is active, it enables a potential of known value to be imposed on the input of the amplifier. The value of the predetermined binary word arbitrarily corresponds to the value which the digital output signal of the device must assume when, in the normal mode of operation, the input of the amplifier receives a voltage whose value is equal to that of the reference potential. In the calibration mode, any difference existing between the digital output signal of the device and the predetermined binary word is detected by the comparison module and compensated by means of the control signal elaborated by the control module as a function of the result of the comparison performed within the comparison module.

Besides, if the invention allows compensation of the offset voltage introduced by the amplifier, it will hereinafter be shown that it can also be used for achieving an optimum adjustment of the value of the gain of said amplifier. This possibility renders the invention additionally interesting because an imperfect regulation of the amplifier gain may also give rise to discontinuity phenomena such as those described hereinbefore.

In a particular embodiment of the invention, the amplifier comprises a first and a second transistor arranged as a differential pair, of which at least one of the bases constitutes the input of the amplifier and at least one of the collectors, which are connected to a same power supply terminal via two load resistors, constitutes the output of the amplifier.

This structure has the advantage of simplicity and allows easy implementation of the invention. Indeed, a particularly advantageous embodiment of the invention is characterized in that, the output of the amplifier being of the differential type and constituted by the collectors of the first and second transistors, the control signal supplied by the control module when the calibration signal is active controls, via the regulating means, an increase of the value of the current flowing through that load resistor which is connected to the collector whose electric potential is highest when the digital output signal has a higher value than that of the predetermined binary word, and an increase of the value of the current flowing through the other load resistor in the opposite case.

The fact that the input and the output of the amplifier are of a differential kind allows a common-mode rejection, i.e. a rejection of the DC components of the signals at the bases of the transistors constituting the differential pair. The DC component of the output signal is then, in principle, exclusively due to the existence of an offset voltage created by the amplifier. If the reference potential is the zero potential, which may be implemented by short-circuiting the bases of the first and second transistors when the calibration signal is active, the output signal of the amplifier, defined, for example, as the potential difference between the collectors of the first and second transistors, must be zero if the median value of the maximum excursion obtained at the output of the A/D converter is chosen for the predetermined binary word. If, at the end of the comparison, it appears that said potential difference is positive, the offset voltage must be compensated by reducing the potential value of the collector of the first transistor, which is obtained by increasing the value of the current flowing through the load resistor which is connected to said collector, and thus the voltage drop at the terminals thereof. If the potential difference between the two collectors is negative, it is the potential of the collector of the second transistor which must be reduced, which is obtained by increasing the value of the current flowing through the load resistor which is connected to said collector.

There are multiple means allowing regulation of the currents flowing through the load resistors. One of these means, which is advantageous because of its simplicity of use, is characterized in that, the emitters of the first and second transistors being connected to a second power supply terminal via a first current source, the regulating means comprise a second current source intended to supply the second power supply terminal with a current whose value is determined by the value of the control signals, the second current source being connected in parallel with two nodes via a first and a second switch intended to be activated by means of at least one of the bits of the control signal, each node being located between one of the load resistors and the first current source.

In this embodiment, the result of the comparison between the digital output signal of the device and the predetermined binary word controls the closure of one of the two switches, thus causing conduction of the current supplied by the second current source through the corresponding resistor.

The precision of the regulation described above is improved in a variant of the invention, which is characterized in that the second current source comprises N current sources which are parallel arranged between the second power supply terminal and a node which is common for all the sources, the value $I_i$ of the nominal current supplied by the current source of rank i (for i=1 to N) being equal to $I0/2^{(i-1)}$ in which I0 is a predetermined value, the control signal is a binary word of N+1 bits, of which a correction bit and its logic inverse control the first and second switches, respectively, each residual bit, when being in an active state, controlling the conduction of one of the N current sources constituting the second current source.

According this variant of the invention, the value of the additional current flowing through the load resistor, at the terminals of which a corrective voltage drop must be generated, is controllable. This allows a more precise compensation of the offset voltage induced by the amplifier. Moreover, with the control being effected in a digital way, it is easy to store the corresponding control signal in a register so as to maintain the compensation of the offset voltage when the device is in its normal mode of operation.

The control module may elaborate the optimum value of the control signal by way of successive approximations and notably by applying a dichotomy method. An embodiment of this variant of the invention is thus characterized in that:

the calibration signal being active during at least N times a comparison cycle, in the course of which an analog signal at the output of the amplifier is converted into a digital signal and then compared with the predetermined binary word, the comparison module is provided with a register intended to store, in the course of a control cycle whose duration is at least equal to that of a comparison cycle, the value taken by the output signal of the comparator in the course of at least one of the previous control cycles, the control module is provided with means for placing, in the course of the first control cycle, the correction bit of the control signal at the active state if the value of the signal which it receives at its input indicates that the digital output signal has a higher value than the predetermined binary word, and at the inactive level in the opposite case, and those bits which control the conduction of the source of rank 1 systematically at the active state, the control module is provided with means for systematically placing at the active state, in the course of any subsequent control cycle, the bit of the rank subsequent to that of the previous bit whose state has been modified in the course of the previous cycle, the previous bit being unchanged if the value of the signal which it receives at its input is identical to that of the signal received at the end of the previous control cycle, and inversed in the opposite case, the process being repeated until the calibration signal resumes the inactive state.

In a preferred embodiment of the invention, an A/D conversion device as described above is characterized in that the calibration signal being active during at least N.P comparison cycles, each control cycle comprises P comparison cycles, the comparison module is provided with a register intended to store the values taken by the output signal of the comparator at the end of each one of the P successive comparisons carried out in the course of a same control cycle, and with a weighting module intended to supply, at an output, a signal whose value is representative of an average of said values, said output constituting the output of the comparison module.

The weighting of the results of P successive comparisons enables to avoid oscillations due to untimely corrections. Indeed, the output of the comparison module including a weighting module is representative of a tendency materialized by at least P/2 comparison results. This weighting thus allows a limitation of the effects which would be produced by an accidental difference between the digital output signal of the device and the predetermined binary word, which would be due to, for example, an erroneous conversion.

As stated hereinbefore, such an A/D conversion device may be used advantageously within an A/D conversion circuit having a two-step structure. The invention thus also relates to an A/D conversion circuit having an input intended to receive an analog input signal, and an output intended to supply a digital output signal, comprising:

a first A/D conversion device having an input and an output respectively intended to receive the analog input signal of the device and supply a signal of a digital kind, referred to as most significant word, constituting the most significant part of the digital output signal of the circuit, a D/A converter intended to receive the most significant word and to convert it into an output signal of an analog kind, referred to as converted signal, a second AID conversion device having an analog input intended to receive the difference between the converted signal and the input signal of the circuit, and an output intended to supply a signal of a digital kind, referred to as least significant word constituting the least significant part of the digital output signal of the circuit, said conversion circuit being characterized in that at least one of the two A/D conversion devices is in accordance with any one of the embodiments described hereinbefore.

These and other aspects of the invention are apparent from and will be elucidated with reference to the embodiments described hereinafter.

DESCRIPTION OF THE PREFERRED EMBODIMENTS

Figure 1:
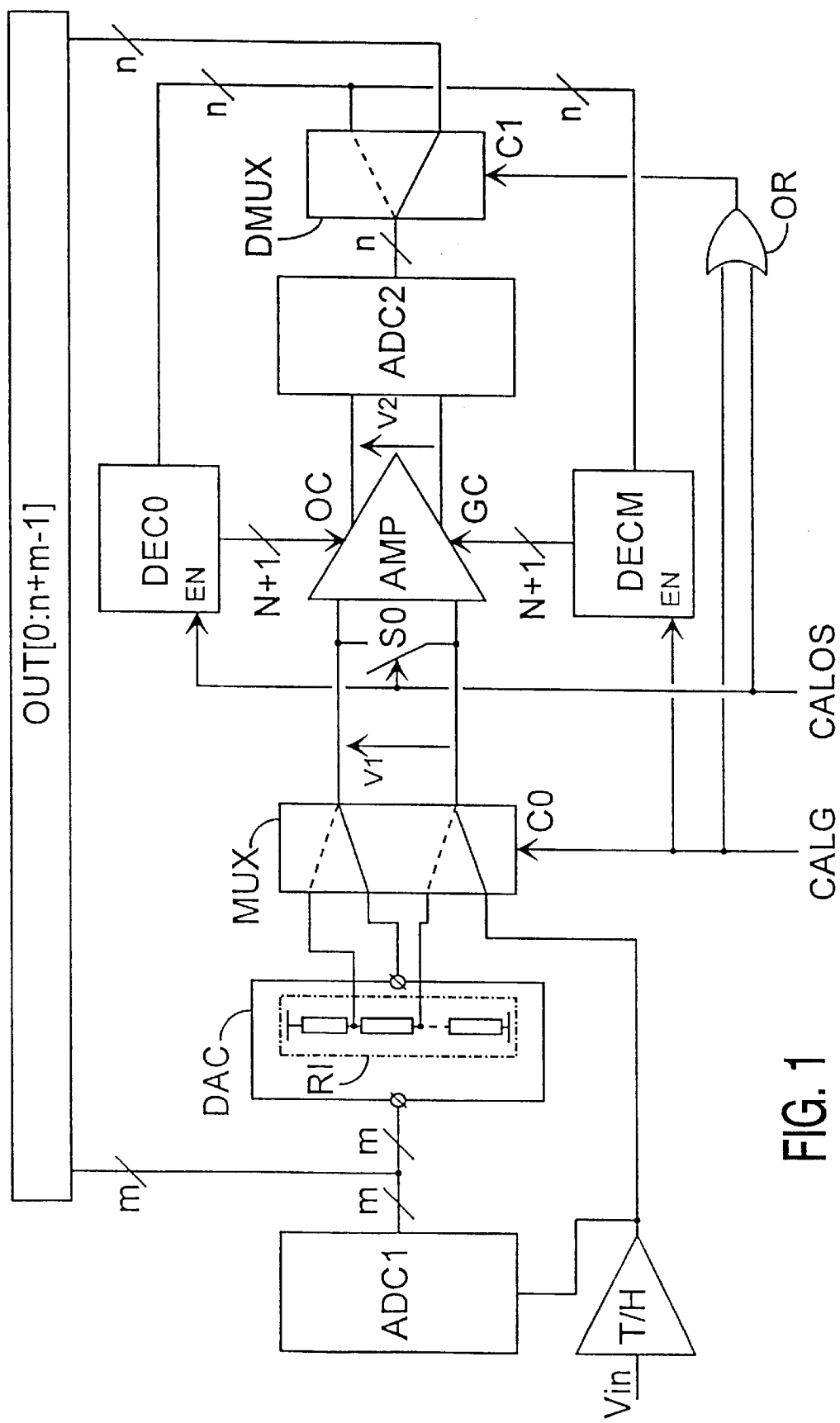
FIG. 1 is a circuit diagram of a two-step A/D conversion circuit in which the invention is used.

FIG. 1 shows diagrammatically a two-step A/D conversion circuit in which the invention is used. This circuit has an input intended to receive an analog input signal Vin via a track-and-hold circuit T/H in this example, and an output intended to supply a digital output signal OUT[0:n+m−1], and comprises:

a first A/D converter ADC1 having an input and an output respectively intended to receive the analog input signal Vin of the circuit, and to supply a signal OUT[n:m−1] of a digital kind, referred to as most significant word constituting the most significant part of the digital output signal OUT[0:n+m−1] of the circuit, a D/A converter DAC intended to receive the most significant word OUT[n:m−1], and to convert it into an output signal of an analog kind, referred to as converted signal, an A/D conversion device having an analog input intended to receive a voltage V1, referred to as residual signal, which represents the difference between the converted signal and the input signal Vin of the circuit, and an output intended to supply a signal OUT[0:n−1] of a digital kind, referred to as least significant word, constituting the least significant part of the digital output signal OUT[0:n+m−1] of the circuit.

This conversion device comprises:

an amplifier AMP having an output supplying a voltage V2 and a differential input intended to receive the residual signal V1, provided with regulating means, which are controlled by digital control signals OC and GC, for adjusting the value of the voltage V2 supplied by the output of the amplifier AMP, a second A/D converter ADC2 having an analog input connected to the output of the amplifier AMP and thus receiving the voltage V2, and an output intended to supply the digital output signal of the device, which constitutes the least significant word of the smallest weight OUT[0:n−1].

The conversion device also has two inputs intended to receive a DC level calibration signal CALOS and a gain calibration signal CALG. It comprises a switch S0 for setting the input of the amplifier AMP at a zero potential by short-circuiting its differential input when the DC level calibration signal CALOS is active, and a multiplexer MUX for setting the input of the amplifier AMP at a reference potential when the gain calibration signal CALG is active. In this example, the D/A converter DAC performs the conversion on the basis of reference voltages elaborated by means of a resistance ladder RL of resistors having identical nominal values and arranged in series between two power supply terminals. This resistance ladder RL is advantageously chosen as being the same as that used within the first A/D converter ADC1. The value of the voltage at the terminals of one of the resistors, which corresponds to the analog value of the least significant bit of the most significant word OUT[n:m−1], determines the maximum quantization error made by the first A/D converter ADC1, and thus the maximum value of the residual signal V1. The reference potential used for the gain calibration of this amplifier must thus be equal to this maximum value.

The device comprises a DC level calibration arrangement DECO which receives the least significant word OUT[0:n−1] via a demultiplexer DMUX when the DC level calibration signal CALOS is active, and compares this word with a predetermined binary word whose value is the median value of the maximum excursion obtained at the output of the second A/D converter ADC2. The DC level calibration arrangement supplies a DC level control signal OC which is of a digital kind and is coded at N+1 bits in this example. The device also comprises a gain calibration arrangement DECM which receives the least significant word OUT[0:n−1] via the demultiplexer DMUX when the gain calibration signal CALG is active, and compares this word with a predetermined binary word whose value, in this example, is the maximum value which can be assumed by the output of the second A/D converter ADC2. The gain calibration arrangement supplies a gain control signal OC which is of a digital kind and is also coded at N+1 bits in this example. The demultiplexer DMUX is thus operated by one or the other of the calibration signals via the logic OR gate OR.

Figure 2:
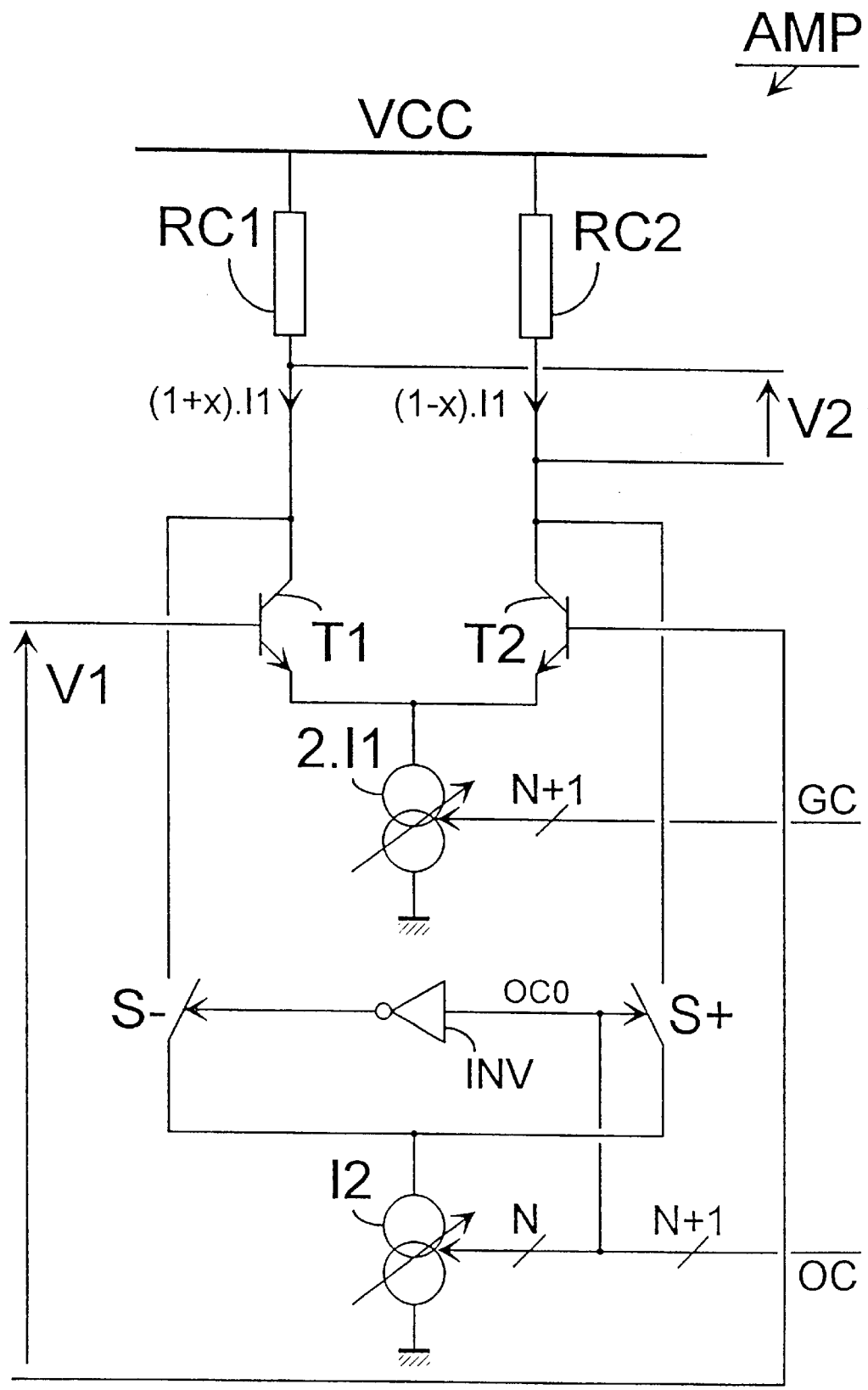
FIG. 2 is an electric circuit diagram of an amplifier in a conversion device in accordance with a particular embodiment of the invention.

FIG. 2 shows diagrammatically a structure chosen for the amplifier AMP in a particular embodiment of the invention. This amplifier AMP comprises a first transistor T1 and a second transistor T2 arranged as a differential pair, of which the bases constitute a differential input intended to receive the residual signal V1. In principle, the first and second transistors are identical, save for variations induced by the manufacturing process. The collectors of the first and second transistors T1 and T2 are connected to the same power supply terminal VCC via two load resistors RC1 and RC2 which, in principle, have identical nominal values. The output of the amplifier AMP is of a differential kind and is constituted by the collectors of the first and second transistors T1 and T2, and supplies the voltage V2. The emitters of the first and second transistors T1 and T2 are connected to a second power supply terminal which constitutes the ground of the circuit via a first current source I1. The amplifier AMP is provided with means for regulating the voltage V2 supplied at its output, which means comprise a second current source intended to supply a current I2 to ground of the circuit, which current has a value determined by the value of the DC level control signal OC. This second current source is connected in parallel with the collectors of the first and second transistors T1 and T2 via a first switch S− and a second switch S+ intended to be activated by means of a bit OC0 of the control signal OC. In a variant of this embodiment, it is also envisageable to connect the second current source to the emitters of these transistors. The DC level control signal OC, supplied by the DC level calibration arrangement when the DC level calibration signal is active, controls the regulating means described above.

When the value of the least significant word OUT[0:n−1] is higher than the median value of the maximum excursion obtained at the output of the second A/D converter ADC2, this means that the voltage V2 is positive, while it should be zero since the inputs of the amplifier AMP are short-circuited. This shows the presence of an offset voltage induced by the amplifier AMP, which must be compensated by increasing the value of the current flowing through the load resistor RC1. The bit OC0 then assumes a logic state 0 which, inverted by means of the inverter INV, controls the closure of the switch S−, with the switch S+ remaining open. The resistor RC1 is then traversed by an additional current I2 which increases the value of the voltage drop present at the terminals of the load resistor RC1 and thus reduces the output voltage V2 towards zero. Inversely, if the value of the least significant word OUT[0:n−1] of the device is lower than that of the predetermined binary word, this means that the voltage V2 is negative, while it should be zero. This offset voltage induced by the amplifier AMP must be compensated by increasing the value of the current flowing through the load resistor RC2. The bit OC0 then assumes a logic state 1 which controls the closure of the switch S+, with the switch S− remaining open. The resistor RC2 is then traversed by an additional current I2 which increases the value of the voltage drop present at the terminals of the load resistor RC2 and thus increases the output voltage V2 towards zero. The regulation of the value of the current I2 supplied by the second current source will be described hereinafter.

The regulating means also provide the possibility of varying the value of the current I1 supplied by the first current source. This allows a regulation of the gain value of the amplifier AMP at an optimum value, which enables the conversion device to supply a least significant word OUT[0:n−1] which assumes its maximum value when the input of the amplifier AMP receives a voltage V1 whose value is the analog value of the least significant bit of the most significant word OUT[n:m−1]. Indeed, it is clearly apparent from the Figure that the value of the voltage V2 is directly dependent on the current I1 supplied by the first current source, when the offset voltage is zero or is completely compensated. If RC1=RC2=RC, the voltage V2 is expressed as V2=2.RC.x.I1 in which x represents a conduction rate of the first transistor T1 with respect to the second transistor T2. A variation of the value of I1 thus causes a variation of the value of the output voltage V2 of the amplifier AMP. Unlike the second current source, the first current source must always be conducting because it biases the differential pair T1, T2. The value of the current I1 which it supplies develops in the following way: when the value of the least significant word OUT[0:n−1] is lower than the maximum value which can be assumed by the output of the second A/D converter ADC2, this means that the voltage V2, and thus the gain of the amplifier AMP, is too low, which must be compensated by an increase of the value of the current I1 supplied by the first current source. If the value of the least significant word OUT[0:n−1] is equal to the maximum value which may be assumed by the output of the second A/D converter ADC2, this may mean that the gain of the amplifier AMP is too high and that the second A/D converter ADC2 is in a saturation mode, i.e. it supplies the same output signal for all the input signals having a value which exceeds a given threshold it receives. The gain of the amplifier AMP is thus reduced by means of the gain control signal GC which effects a reduction of the value of the current I1 supplied by the first current source. If, after this correction, the value of the least significant word OUT[0:n−1] is still found to be equal to the maximum value which may be assumed by the output of the second A/D converter ADC2, this indeed means that the gain of the amplifier AMP is too high and that the second A/D converter is in the saturation mode. The gain of the amplifier AMP must thus be reduced again. The balance searched is signalized by a change of the result of the comparison described above. When this change occurs, the previous regulation of the value of the gain control signal GC, previously stored in a register, is validated and will be used in the normal operating mode of the device.

Figure 3:
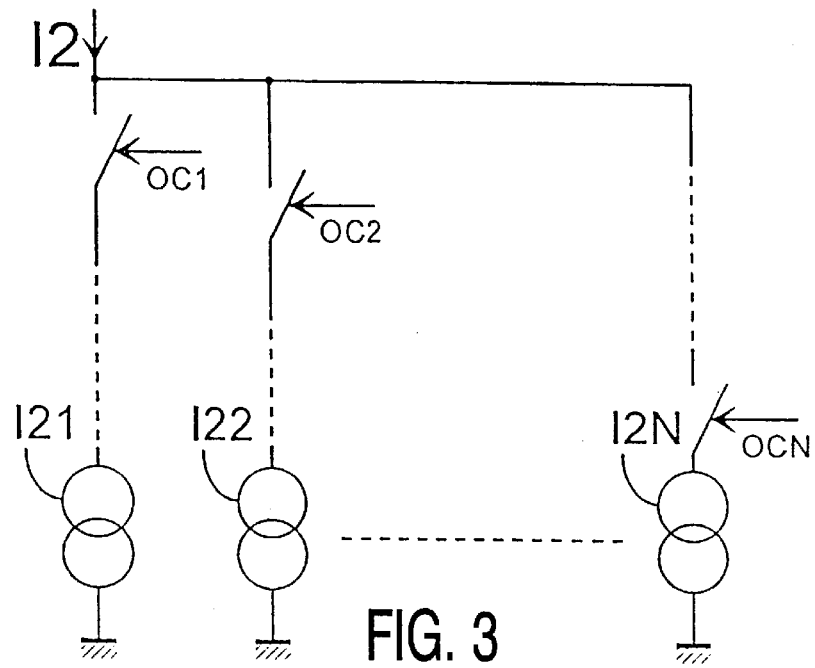
FIG. 3 is an electric circuit diagram of a current source included in such an amplifier.

FIG. 3 shows diagrammatically an embodiment of the second current source and the device used for regulating the value of the current I2 supplied thereby. This source comprises N current sources arranged in parallel between the ground of the circuit and a node, which is common for all the sources and intended to be traversed by the current I2. The value $I2_i$ of the nominal current supplied by the current source of rank i (for i=1 to N) is equal to $I0/2^{(i-1)}$ in which I0 is a predetermined value. In conformity with the previous statement, the DC level control signal OC is a binary word of N+1 bits, of which a bit OC0 referred to as correction bit and its logic inverse control the first and second switches S+ and S−, respectively, enabling the offset voltage within the amplifier AMP to be compensated. Each of the residual bits OCi, for i=1 to N, controls, in the active state, the conduction of one of the N current sources $I2_i$, for i=1 to N, constituting the second current source. A similar structure will be advantageously chosen for realizing the first current source controlled by the gain control signal GC.

Figure 4:
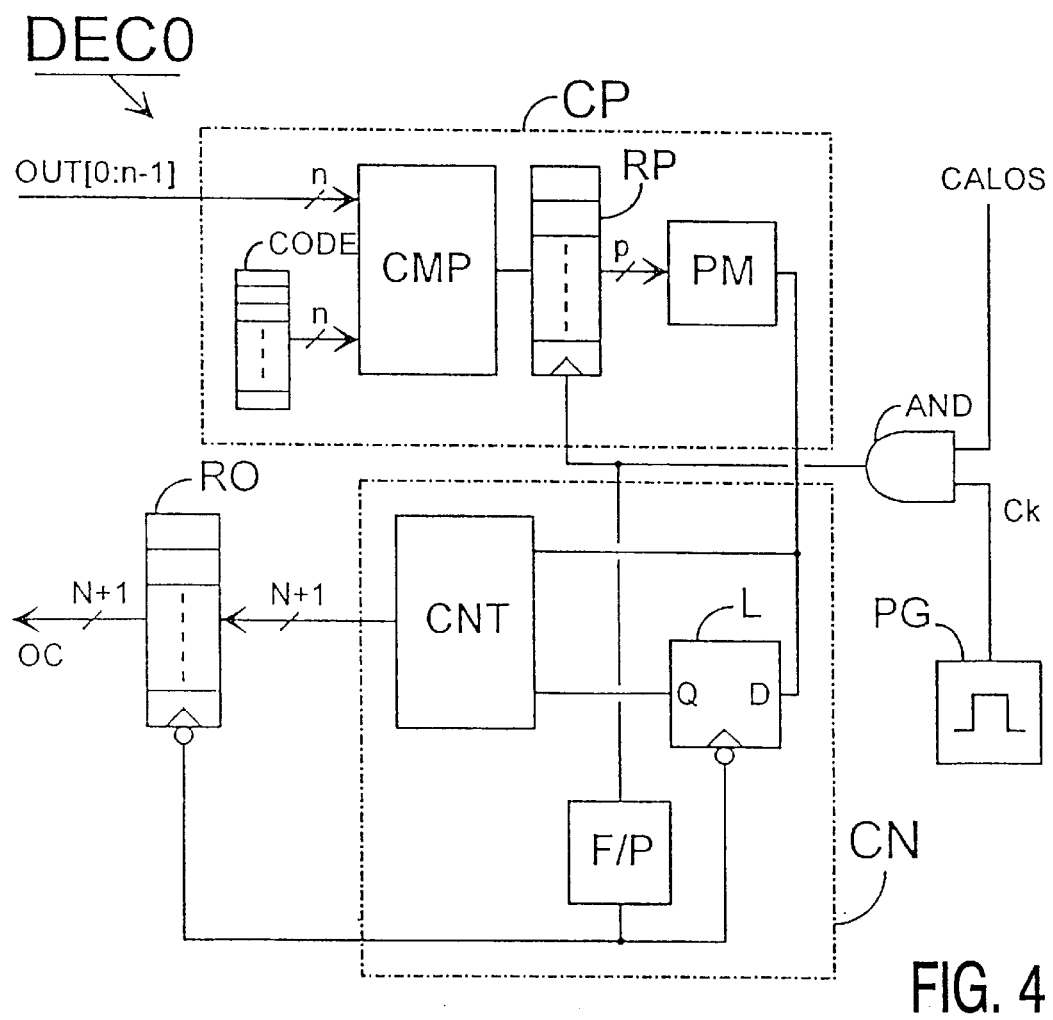
FIG. 4 is a circuit diagram of a calibration arrangement which is present in a variant of the invention.

FIG. 4 shows diagrammatically the DC level calibration arrangement DEC0 which is present in a variant of the invention. This arrangement comprises:

a comparison module CP comprising a comparator CMP intended to supply, at an output, a signal which is representative of at least one comparison between the digital output signal OUT[0:n−1] of the second converter ADC2 and a predetermined binary word which is stored in a register CODE and whose value is the median value of the maximum excursion obtained at the output of the second A/D converter ADC2, a control module CN having an input connected to the output of the comparison module, intended to supply the DC level control signal OC whose elaboration will be described hereinafter, and a register R0 in which the value of the control signal OC is stored when the conversion device is in its normal operating mode.

The calibration arrangement DECO receives the calibration signal CALOS which is active during at least N times a duration referred to as comparison cycle, in the course of which the output voltage V2 of the amplifier AMP is converted into a digital signal by the second A/D converter ADC2 and then compared with the binary word stored in the register CODE. The comparison module CP is provided with a register RP intended to store, in the course of a control cycle whose duration is at least equal to that of a comparison cycle, the value taken by the output signal of the comparator CMP in the course of at least one of the previous control cycles.

In the variant of the invention described here, the calibration signal CALOS is active during at least N.P comparison cycles, and each control cycle comprises P comparison cycles. The register RP of the comparison module CP is rhythmed by a clock signal Ck supplied by a pulse generator PG and enabled by the DC level calibration signal CALOS by means of a logic AND gate AND. This register RP is intended to store the values taken by the output signal of the comparator CMP at the end of each one of the P successive comparisons carried out in the course of a same control cycle. The comparison module CP is also provided with a weighting module PM intended to supply, at an output, a signal whose value is representative of an average of said values, said output constituting the output of the comparison module CP. The output signal of the comparison module CP is thus representative of a tendency materialized by at least P/2 identical comparison results, which enables to avoid oscillations resulting from inadvertent corrections caused by accidental differences between the digital output signal OUT[0:n−1] of the second A/D converter ADC2 which would be due to, for example, an erroneous conversion. The control module CN comprises a latch L intended to store, in the course of a control cycle, the value of the output signal from the comparison module CMP at the end of the previous cycle. Since a control cycle lasts P comparison cycles, this latch L is rhythmed by a signal delivered by a frequency divider F/P whose input receives the clock signal Ck and supplies a signal whose frequency is P times lower. The control module CN places, during the first control cycle, the correction bit OC0 of the DC state control signal OC at the active level if the value of the signal supplied by the comparison module CP indicates that the value of the digital output signal OUT[0:n−1] of the second A/D converter ADC2 is higher than the value of the binary word stored in the register CODE, and at the inactive state in the opposite case, and the bit OC1 systematically at the active state. In the course of any subsequent control cycle, the control module CN systematically places at the active state the bit of the rank subsequent to that of the previous bit whose state has been modified in the course of the previous cycle, the previous bit being unchanged if the value of the signal supplied by the comparison module CP is identical to that of the signal supplied at the end of the previous control cycle, and inversed in the opposite case. This process is repeated until the DC level calibration signal CALOS resumes the inactive state, thus causing the DC level control signal OC to be stored in the register RO. A structure which is similar to that described above will be advantageously chosen for realizing the gain calibration arrangement DECM.

What is claimed is:

1. An A/D conversion device having an input intended to receive an analog input signal, and an output intended to supply a digital output signal, comprising:

an amplifier having an output and an input intended to receive the analog input signal of the device, provided with regulating means, controlled by a digital control signal, for adjusting the value of a voltage supplied by the output of the amplifier, an A/D converter having an analog input connected to the output of the amplifier and an output intended to supply the digital output signal of the device, said conversion device being characterized in that it has an input intended to receive a calibration signal, said calibration signal being coupled to said amplifier, and in that it comprises means for setting the input of the amplifier at a predetermined reference potential when the calibration signal is active, and a calibration arrangement comprising:

a comparison module, activated when the calibration signal is active, comprising a comparator intended to supply, at an output, a signal which is representative of at least one comparison between the digital output signal and a predetermined binary word, a control module having an input connected to the output of the comparison module and being activated when the calibration signal is active, intended to supply the control signal, whose value depends on the value of a signal received at the input of the control module, and storage means in which the value of the control signal is stored when the calibration signal is inactive.

2. An A/D conversion device as claimed in claim 1, characterized in that the amplifier comprises a first and a second transistor arranged as a differential pair, of which at least one of the bases constitutes the input of the amplifier and at least one of the collectors, which are connected to a same power supply terminal via two load resistors, constitutes the output of the amplifier.

3. An A/D conversion device as claimed in claim 2, characterized in that, the output of the amplifier being of the differential type and constituted by the collectors of the first and second transistors, the control signal supplied by the control module when the calibration signal is active controls, via the regulating means, an increase of the value of the current flowing through that load resistor which is connected to the collector whose electric potential is highest when the digital output signal has a higher value than that of the predetermined binary word, and an increase of the value of the current flowing through the other load resistor in the opposite case.

4. An A/D conversion device as claimed in claim 3, characterized in that, the emitters of the first and second transistors being connected to a second power supply terminal via a first current source, the regulating means comprise a second current source intended to supply the second power supply terminal with a current whose value is determined by the value of the control signals, the second current source being connected in parallel with two nodes via a first and a second switch intended to be activated by means of at least one of the bits of the control signal, each node being located between one of the load resistors and the first current source.

5. An A/D conversion device as claimed in claim 4, characterized in that the second current source comprises N current sources which are parallel arranged between the second power supply terminal and a node which is common for all the sources, the value $I_i$ of the nominal current supplied by the current source of rank i (for i=1 to N) being equal to $I0/2^{(i-1)}$ in which I0 is a predetermined value, the control signal is a binary word of N+1 bits, of which a correction bit and its logic inverse control the first and second switches, respectively, each residual bit, when being in an active state, controlling the conduction of one of the N current sources constituting the second current source.

6. An A/D conversion device as claimed in claim 5, characterized in that the calibration signal being active during at least N times a comparison cycle, in the course of which an analog signal at the output of the amplifier is converted into a digital signal and then compared with the predetermined binary word, the comparison module is provided with a register intended to store, in the course of a control cycle whose duration is at least equal to that of a comparison cycle, the value taken by the output signal of the comparator in the course of at least one of the previous control cycles, the control module is provided with means for placing, in the course of the first control cycle, the correction bit of the control signal at the active state if the value of the signal which it receives at its input indicates that the digital output signal has a higher value than the predetermined binary word, and at the inactive state in the opposite case, and those bits which control the conduction of the source of rank 1 systematically at the active state, the control module is provided with means for systematically placing at the active state, in the course of any subsequent control cycle, the bit of the rank subsequent to that of the previous bit whose state has been modified in the course of the previous cycle, the previous bit being unchanged if the value of the signal which it receives at its input is identical to that of the signal received at the end of the previous control cycle, and inversed in the opposite case, the process being repeated until the calibration signal resumes the inactive state.

7. An A/D conversion device as claimed in claim 6, characterized in that the calibration signal being active during at least N.P comparison cycles, each control cycle comprises P comparison cycles, the comparison module is provided with a register intended to store the values taken by the output signal of the comparator at the end of each one of the P successive comparisons carried out in the course of a same control cycle, and with a weighting module intended to supply, at an output, a signal whose value is representative of an average of said values, said output constituting the output of the comparison module.

8. An A/D conversion circuit having an input intended to receive an analog input signal, and an output intended to supply a digital output signal, comprising:

a first A/D conversion device having an input and an output respectively intended to receive the analog input signal of the circuit, and to supply a signal of a digital kind, referred to as most significant word, constituting the most significant part of the digital output signal of the circuit, a D/A converter intended to receive the most significant and to convert it into an output signal of an analog kind, referred to as converted signal, a second A/D conversion device having an analog input intended to receive the difference between the converted signal and the input signal of the circuit, and an output intended to supply a signal of a digital kind, referred to as the least significant word, constituting the least significant part of the digital output signal of the circuit, said conversion circuit being characterized in that at least one of the two A/D conversion devices is conform claim 1.

* * * * *